United States Patent [19]

Stiegler

[11] Patent Number: 4,692,638

[45] Date of Patent: Sep. 8, 1987

[54] CMOS/NMOS DECODER AND HIGH-LEVEL DRIVER CIRCUIT

[75] Inventor: Harvey J. Stiegler, Houston, Tex.

[73] Assignee: Texas Instruments Incorporated, Dallas, Tex.

[21] Appl. No.: 626,576

[22] Filed: Jul. 2, 1984

[51] Int. Cl.[4] .................. G11C 80/00; H03K 19/094
[52] U.S. Cl. .................................. 307/449; 307/452; 307/482; 307/578
[58] Field of Search ............... 307/443, 449, 452, 453, 307/463, 481, 482, 577, 578, 579

[56] References Cited

U.S. PATENT DOCUMENTS

| 3,903,431 | 9/1975 | Heeren | 307/482 |
| 4,511,811 | 4/1985 | Gupta | 307/449 |
| 4,542,310 | 9/1985 | Ellis et al. | 307/482 |

Primary Examiner—Stanley D. Miller
Assistant Examiner—M. R. Wambach
Attorney, Agent, or Firm—John G. Graham

[57] ABSTRACT

A decoder and driver circuit for producing an output voltage exceeding the power supply uses a CMOS decode circuit followed by NMOS output stage and pump circuit. The pump clock is derived from a controlled oscillator, and the oscillator is synchronized with the access cycle of the memory device in which the circuit is used, so retention of the high level output is assured for an indefinitely long cycle time.

9 Claims, 2 Drawing Figures

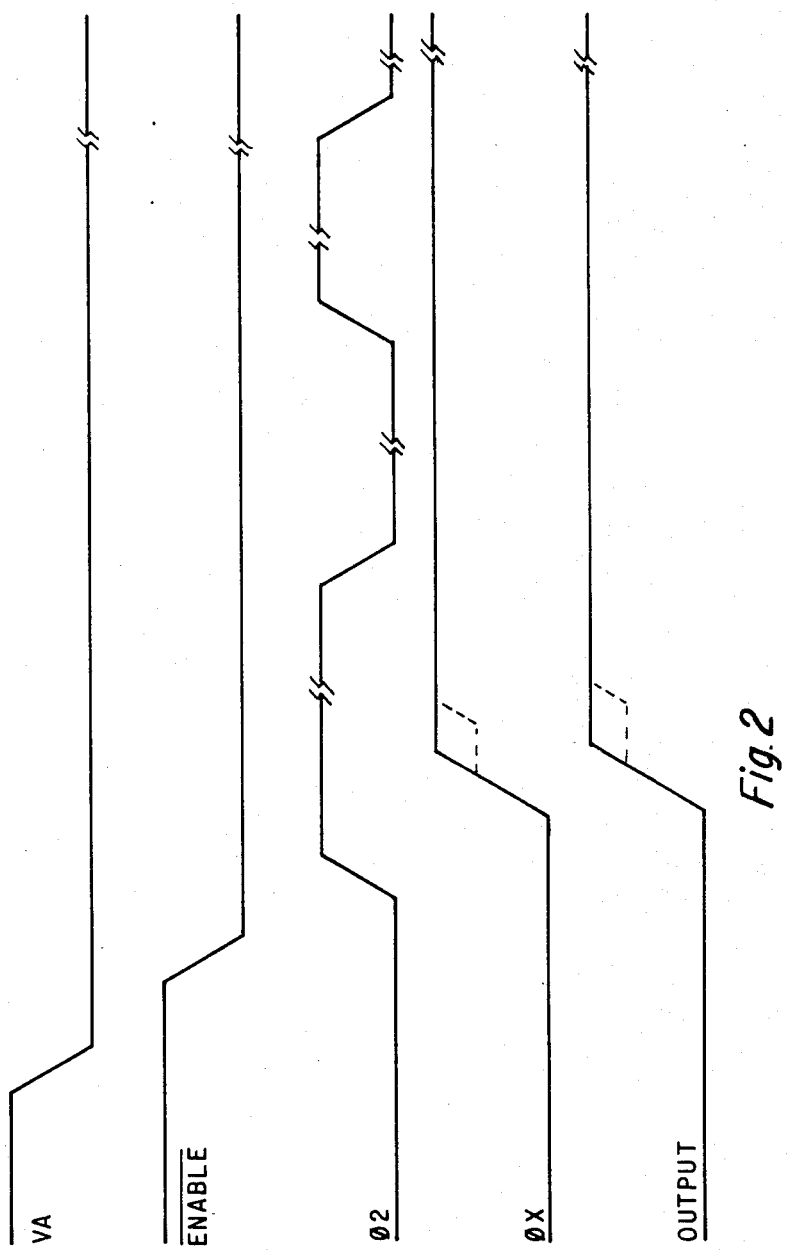

CMOS/NMOS DECODER AND HIGH-LEVEL DRIVER CIRCUIT

BACKGROUND OF THE INVENTION

This invention relates to semiconductor devices, and more particularly to decoder circuits of the type used in VLSI semiconductor memory devices or the like.

Semiconductor memory devices of the dynamic read/write type are constructed as shown in U.S. Pat. No. 4,239,993, issued to McAlexander, White and Rao, assigned to Texas Instruments. As set forth in such Patent, some of the clocks and control signals are preferably boosted to voltage levels above the supply. For example, the row lines are boosted so that a full one level can be written into the storage capacitors. Thus, the row decoder which activates the row lines must produce an output exceeding the power supply voltage. This is accomplished in NMOS circuitry by bootstrapping, but is not as easily achieved in CMOS technology.

It is the principal object of this invention to provide improved decoder and output drive circuits for semiconductor dynamic memory devices, particularly using CMOS circuitry. Another object is to provide an improved decoder and driver ciruit which produces an output exceeding the power supply voltage.

SUMMARY OF THE INVENTION

In accordance with one embodiment of the invention, a decoder and driver circuit for producing an output voltage exceeding the power supply uses a CMOS decode circuit followed by NMOS output stage and pump circuit. The pump clock is derived from a controlled oscillator, and the oscillator is synchronized with the access cycle of the memory device in which the circuit is used, so retention of the high level output is assured for an indefinitely long cycle time.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows:

FIG. 2 is a timing diagram showing voltage as a function of time for various nodes in the circuit of FIG. 1.

DETAILED DESCRIPTION OF SPECIFIC EMBODIMENT

Figure 1:
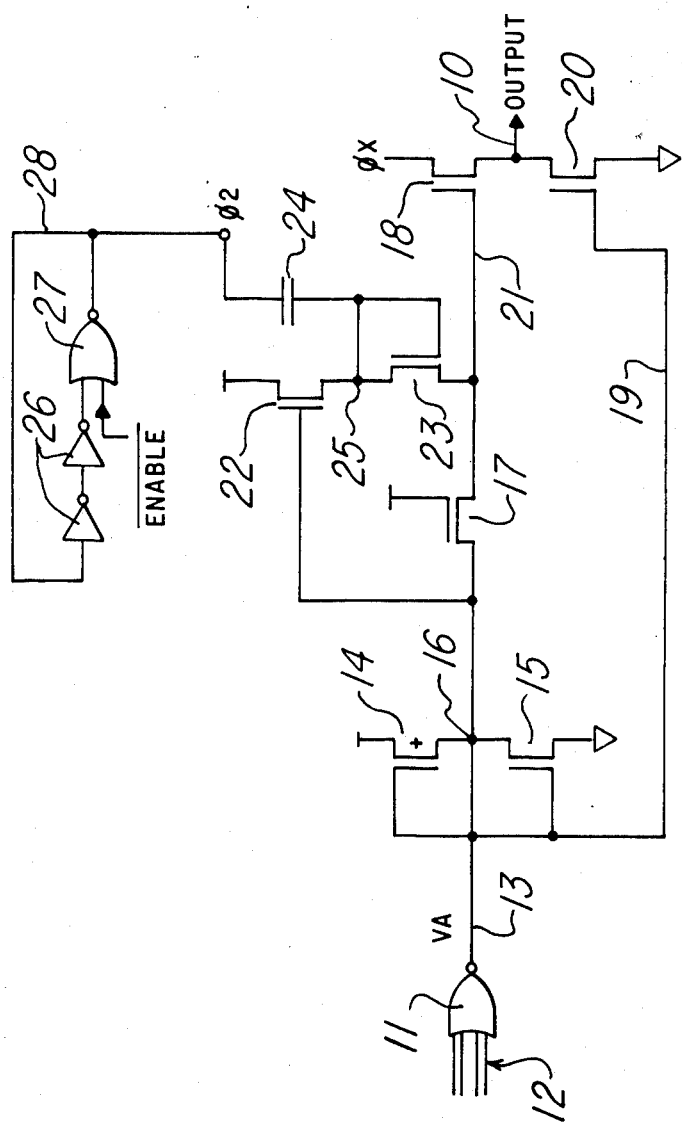
FIG. 1 is an electrical schematic diagram of a decoder and driver circuit according to the invention.

A circuit for generating a decoded output which is boosted above the supply level as shown in FIG. 1. This circuit is in this example used to boost the word lines 10 in a dynamic RAM array as in U.S. Pat. No. 4,239,993, issued to McAlexander, White and Rao, assigned to Texas Instruments. Each row line 10 has a NOR circuit 11 which functions as decoder to select one-of-N rows, where N may be for example 256, or 128. That is, there are 256 row decoder NOR gates 11 in the memory device, one for each row line 10. The inputs 12 of the NOR gate 11 are the A and $\overline{A}$ outputs of address buffers as described in the U.S. Pat. No. 4,280,010. The NOR gate output at node 13 is connected to the gate of CMOS inverter transistors 14 and 15, the top one P-channel and the lower one N-channel. The output node 16 of this inverter is connected through an isolating transistor 17 (with gate connected to Vcc), to the gate of a transistor 18 which has the row clock $\phi X$ on its drain. The non-inverted voltage on the node 13 is connected by line 19 to the gate of a transistor 20 to ground the row line 10 when node 13 is high, i.e., non-selected; this occurs when not all inputs 12 to this decoder NOR gate are low. When the node 13 is high, the transistor 15 is on and the gate of transistor 18 is held low by the node 16. However, when node 13 is low, transistor 14 is on and transistor 15 is off, holding the gate of transistor 18 at node 21 high, so the transistor 18 is on and the output 10 is connected to $\phi X$. The node 21 is pumped above the supply Vcc by a circuit including N-channel transistors 22 and 23, capacitor 24, and clock $\phi 2$. When the node 16 is high, the transistor 22 is on and node 25 goes high, which swiches the gated MOS capacitor 24 to its high capacitance mode and so the clock $\phi 2$ can pump the node 21 above Vcc through transistor 23. When node 16 is low, transistor 22 is off, node 25 is prevented from charging by the path through transistors 23, 17 and 15. The clock $\phi 2$ is generated in an oscillator circuit consisting of two inverters 26 and a NOR gate 27, with feedback 28; one input of the NOR gate 27 is an enable signal generated from a chip enable signal such as $\overline{RAS}$ or $\overline{CE}$, a common input to a dynamic memory. Thus, the clock $\phi 2$ exists only when $\overline{RAS}$ is low, i.e., during an active cycle, and the pumping of node 21 repeats for an indefinitely long cycle. During inactive periods of no memory access, the clock $\phi 2$ does not occur, because the enable signal is high and the output of the NOR gate 27 stays low.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A CMOS row decoder and row line driver circuit, comprising:

a logic gate having a plurality of address and address-complement inputs, and an output which is of one logic state for selection and the other logic state for non-selection, a CMOS inverter with a P-channel transistor and an N-channel transistor, said transistors having source-to-drain paths connected in series between a voltage supply and ground, and an output node at the juncture of such source-to-drain paths, the gates of said transistors being connected to said output of said logic gate, an output stage having first and second transistors, each having a source-to-drain path and a gate, and a first clock source, the source-to-drain path of the first transistor connecting said first clock source to a row line output, the source-to-drain path of said second transistor connecting said row line output to ground, the gate of said second transistor being connected to said output of said logic gate, a voltage-boost circuit connected to the gate of said first transistor and including a series transistor having a source-to-drain path and a gate, the source-to-drain path of said series transistor being connected between a voltage supply and an intermediate node, and the gate of said series transistor being connected to said output node of said inverter, unidirectional conductive means connecting said intermediate node to said gate of said first transistor, a second clock source connected to said intermediate node through a gated capacitor.

2. A circuit according to claim 1 wherein said unidirectional conductive means is an MOS transistor having its source-to-drain path connected between said intermediate node and said gate of said first transistor, said MOS transistor having a gate connected to said intermediate node.

3. A circuit according to claim 1 wherein said output node of said inverter is connected to said gate of the first transistor through the source-to-drain path of an isolating transistor which has its gate connected to a voltage supply.

4. A circuit according to claim 1 wherein said second voltage source is enabled by a chip-enable clock voltage.

5. A driver circuit, comprising:

a logic gate having a plurality of inputs, and an output which is one logic state for one set of said inputs and the other logic state for another set of said inputs, an inverter with a first transistor and a second transistor, said transistors having source-to-drain paths connected in series between a voltage supply and ground, said first and second transistors having opposite channel conductivity-type, and an output node at the juncture of such source-to-drain paths, the gates of said transistors being connected to said output of said logic gate, an output stage having third and fourth transistors of the same channel-conductivity type, each having a source-to-drain path and a gate, and a first clock source, the source-to-drain path of the third transistor connecting said first clock source to an output line, the source-to-drain path of said fourth transistor connecting said output line to ground, the gate of said fourth transistor being connected to said output of said logic gate, a voltage-boost circuit connected to the gate of said third transistor and including a series transistor having a source-to-drain path and a gate, the source-to-drain of said series transistor being connected between a voltage supply and an intermediate node, and the gate of said series transistor being connected to said output node of said inverter, unidirectional conductive means connecting said intermediate node to said gate of said third transistor, a second clock source connected to said intermediate node though a gated capacitor.

6. A circuit according to claim 5 wherein said second, third and fourth transistors and said series transistor are N-channel MOS transistors; said first transistor is a P-channel transistor.

7. A circuit according to claim 5 wherein said unidirectional conductive means is an MOS transistor having its source-to-drain path connected between said intermediate node and said gate of said third transistor, said MOS transistor having a gate connected to said intermediate node.

8. A circuit according to claim 5, wherein said output node of said inverter is connected to said gate of the third transistor through the source-to-drain path of an isolating transistor which has its gate connected to a positive voltage supply.

9. A circuit according to claim 5 wherein said second clock source is enabled by a chip-enable voltage.

* * * * *